United States Patent
Hiner et al.

(10) Patent No.: US 8,308,921 B1
(45) Date of Patent: Nov. 13, 2012

(54) MASK FOR INCREASED UNIFORMITY IN ION BEAM DEPOSITION

(75) Inventors: Hugh C. Hiner, Fremont, CA (US); Lijie Zhao, Pleasanton, CA (US); Hariharakeshava Hegde, Pleasanton, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 1514 days.

(21) Appl. No.: 11/643,494

(22) Filed: Dec. 21, 2006

(51) Int. Cl.
*C23C 14/00* (2006.01)

(52) U.S. Cl. .................................. 204/298.11

(58) Field of Classification Search .................. 118/500, 118/503; 204/298.01, 298.11, 298.12, 298.15
See application file for complete search history.

(56) References Cited

U.S. PATENT DOCUMENTS

| 4,315,960 | A | * | 2/1982 | Ohji et al. ............... 427/248.1 |
| 6,063,244 | A | | 5/2000 | Pinarbasi |
| 6,197,164 | B1 | | 3/2001 | Pinarbasi |
| 6,447,653 | B1 | * | 9/2002 | Debley et al. ............ 204/192.13 |
| 6,716,322 | B1 | | 4/2004 | Hedge et al. |
| 2003/0129325 | A1 | * | 7/2003 | Kandaka ..................... 427/596 |

FOREIGN PATENT DOCUMENTS

DE 10129313 C1 * 11/2002

* cited by examiner

*Primary Examiner* — Keith Hendricks
*Assistant Examiner* — John Brayton

(57) ABSTRACT

A shaper mask for particle flux includes a central portion extending from a body of the shaper mask along a first axis to block at least a first portion of a particle flux through the shaper mask from a first direction. The mask also includes at least one off-axis portion. Each off-axis portions extends from the body of the shaper mask along a respective second axis different from the first axis. Each off-axis portion is shaped to block a respective second portion of the particle flux traveling through the shaper mask from a second direction different from the first direction.

9 Claims, 1 Drawing Sheet

MASK FOR INCREASED UNIFORMITY IN ION BEAM DEPOSITION

FIELD OF THE INVENTION

The present invention relates to ion beam deposition, and more particularly, to a mask for increased uniformity in ion beam deposition.

BACKGROUND

Ion beam deposition (IBD) is a well-known technique for depositing material on a substrate. In a typical IBD process, an ion beam is directed at a target, producing a flux of particles toward a substrate. Thickness variations in the deposited layers are a common problem, as the flux may not be uniform over the entire substrate. Also, in cases where the material is being deposited on features that extend outwardly from the substrate, there may be undesirable or asymmetric variations in deposition caused by shadowing effects and the like. The substrate may be rotated or moved to produce greater uniformity, but there can still be problems. Beam shapers, sometimes referred to as shapers, flux regulators, or shaper masks, may also be used to promote the desired layer deposition. Unfortunately, such techniques may not entirely correct such deviations from the desired pattern of deposition.

SUMMARY

In particular embodiments of the present invention, a shaper mask for particle flux includes a central portion extending from a body of the shaper mask along a first axis to block at least a first portion of a particle flux through the shaper mask from a first direction. The mask also includes at least one off-axis portion. Each off-axis portions extends from the body of the shaper mask along a respective second axis different from the first axis. Each off-axis portion is shaped to block a respective second portion of the particle flux traveling through the shaper mask from a second direction different from the first direction. In particular embodiments, there are two off-axis portions. In other embodiments, there are four off-axis portions. In various embodiments, the off-axis portions may be placed symmetrically about the first axis.

DETAILED DESCRIPTION OF PREFERRED EXEMPLARY EMBODIMENTS

Figure 1:
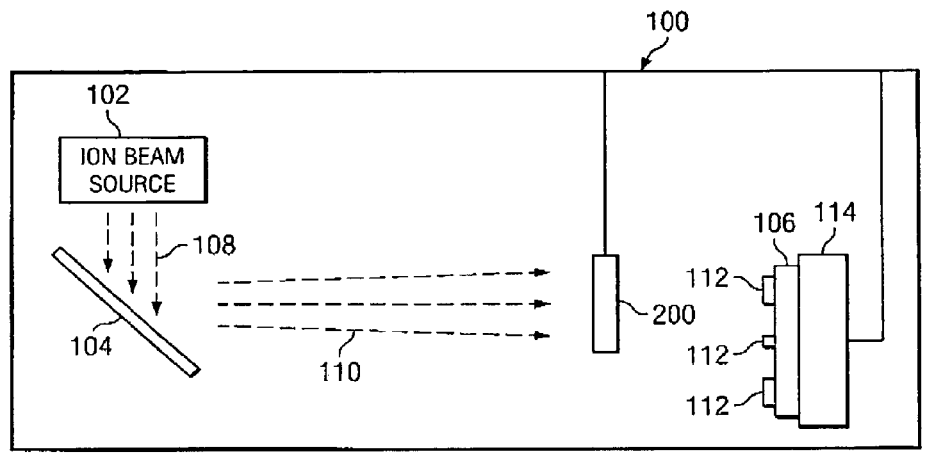
FIG. 1 is a schematic depicting an ion beam deposition system according to a particular embodiment of the present invention.

FIG. 1 illustrates an example of an IBD system 100. IBD system 100 includes an ion beam source 102, a target 104, and a substrate 106. A shaper mask 200 is disposed between the target 104 and the substrate 106. When an ion beam 108 from the ion beam source 110 is directed at the target 104, a flux of particles 110 is emitted from the target 104 toward the substrate 106. A shaper mask 200 shapes the flux 110 toward the substrate 106 as described in greater detail below. Although the operation of the shaper mask 200 is described in the context of ion deposition, it should be understood that the techniques described herein may be applied in the context of any similar situation of non-uniform particle flux deposited on a substrate, particularly in "long throw" deposition methods in which the substrate may tilt and rotate. Examples of other suitable applications include physical vapor deposition (PVD) using a self-biased target and external high-density plasma source deposition with a biased target.

In a particular embodiment, the substrate 106 is a circular wafer formed from silicon or other desired material. The substrate 106 may have features 112 formed at one or more locations extending outwardly from a target-facing side of the substrate 106. Such features 112 may be located at any desired location on the substrate 106, including symmetric or asymmetric placement. The substrate 106 is held in place by a holder 114. In particular embodiments, the holder 114 may translate and/or rotate the substrate 106 so that various locations of the substrate 106 receive different amounts of flux 110 at different times.

Figure 2A:
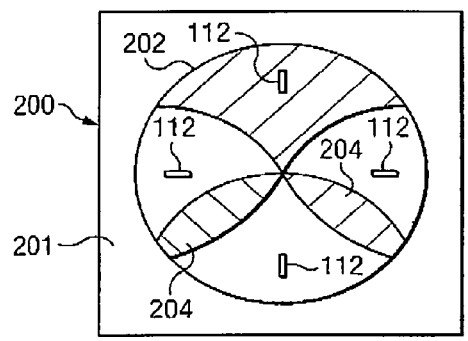
FIGS. 2A, 2B, and 2C are illustrations of shaper masks according to particular embodiments of the present invention.
Figure 2B:
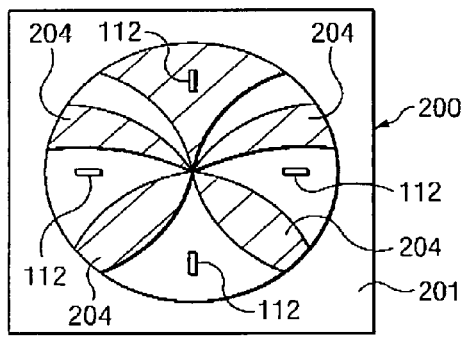

FIGS. 2A and 2B illustrate particular embodiments of the shaper mask 200 with the substrate 106 behind the shaper mask 200 as viewed from the target 104. The shaper mask 200 includes a body 201 of material surrounding an opening for particle flux, with a central portion 202 and one or more off-axis portions 204 extending from the body 201 to block portions of the particle flux through the shaper mask. The central portion 202 extends from the body 201 along a first axis to block a component of the particle flux 110 directed from a first direction while the off-axis portions 204 each extend from the body 201 along a different axis from the first axis, so as to block another component of the particle flux 110. In the embodiment depicted in FIG. 2A, there are two off-axis portions 204, while in the embodiment depicted in FIG. 2B, there are four off-axis portions. Various embodiments may have different numbers of off-axis portions, which may be distributed symmetrically or asymmetrically depending on the desired pattern of flux 110 to reach the substrate 106.

The embodiments illustrated in FIGS. 2A and 2B are particularly suitable for use with a circular substrate 106 that is rotated during deposition. Four positions of a feature 112 are illustrated in FIGS. 2A and 2B. With suitable selection of the size and relative position of the off-axis portions 204, the feature 112 is able to receive flux 110 relatively uniformly on all sides despite there being a distribution in the components of the flux 110 received at the shaper mask 200 from a variety of directions. In particular, the off-axis portions 204 can more evenly distribute deposition between the center and edges of the substrate 106.

Figure 2C:
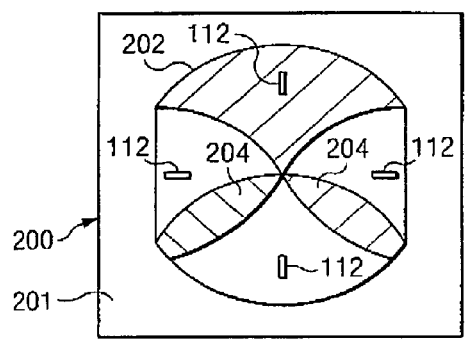

In the embodiments depicted in FIGS. 2A and 2B, openings through the shaper mask 200 have curved edges, which may have a generally circular shape. However, the particular shape of the openings through the shaper mask 200 may be selected to be something other than circular. For example, the embodiment illustrated in FIG. 2C shows straight edges used for some of the openings. The shape of other features of the shaper mask 200 may be varied as well. For example, the off-axis portions 204 may be formed as triangles, ellipsoids, or other desired shapes depending on the particular deposition pattern, uniformity of flux 110 reaching the substrate 106, and the like.

What is claimed is:
1. A shaper mask for particle flux, comprising:
a body surrounding one or more openings, the body being in a first plane;

a central portion extending inwardly from the body of the shaper mask along a first axis in the first plane to block at least a first portion of a particle flux through the shaper mask from a first direction;

at least one off-axis portion, each of the at least one off-axis portions extending inwardly from the body of the shaper mask along a respective second axis in the first plane different from the first axis and each of the at least one off-axis portions shaped to block a respective second portion of the particle flux traveling through the shaper mask from a second direction different from the first direction.

2. The shaper mask of claim 1, wherein the at least one off-axis portion comprises two off-axis portions.

3. The shaper mask of claim 2, wherein the central portion and the off-axis portions at least partially define a first opening of the one or more openings to a first side of the central axis, a second opening of the one or more openings to a second side of the central axis, and a third opening of the one or more openings between the two off-axis portions and along the central axis.

4. The shaper mask of claim 3, wherein the area of the third opening is greater than the respective area of the first and second openings.

5. The shaper mask of claim 2, wherein the off-axis portions are placed symmetrically about the first axis.

6. The shaper mask of claim 1, wherein the central portion and the off-axis portions at least partially define an opening having at least one generally circular edge.

7. The shaper mask of claim 1, wherein the central portion and the off-axis portions at least partially define an opening having at least one straight edge.

8. The shaper mask of claim 1, wherein the at least one off-axis portions is ellipsoidal.

9. The shaper mask of claim 1, wherein the at least one off-axis portion comprises four off-axis portions.

* * * * *